(12) United States Patent
Gambee et al.

(10) Patent No.: US 8,470,710 B2
(45) Date of Patent: Jun. 25, 2013

(54) METHODS OF FORMING A METAL PATTERN

(75) Inventors: Christopher J. Gambee, Caldwell, ID (US); G. Alan VonKrosigk, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 13/610,471

(22) Filed: Sep. 11, 2012

(65) Prior Publication Data

US 2013/0005145 A1    Jan. 3, 2013

Related U.S. Application Data

(60) Continuation of application No. 13/104,215, filed on May 10, 2011, now Pat. No. 8,329,580, which is a continuation of application No. 12/139,969, filed on Jun. 16, 2008, now Pat. No. 8,008,196, which is a division of application No. 11/122,409, filed on May 5, 2005, now Pat. No. 7,402,908.

(51) Int. Cl.
*H01L 21/44* (2006.01)

(52) U.S. Cl.
USPC ..... 438/669; 438/637; 438/675; 257/E23.169

(58) Field of Classification Search
USPC ........... 438/669, 637, 672, 675; 257/E23.169
See application file for complete search history.

(56) References Cited

U.S. PATENT DOCUMENTS

| | | | |
|---|---|---|---|
| 4,592,800 A | 6/1986 | Landau et al. |
| 5,045,903 A | 9/1991 | Meyer et al. |
| 5,182,234 A | 1/1993 | Meyer et al. |
| 5,256,583 A | 10/1993 | Hollinger et al. |
| 5,582,679 A | 12/1996 | Lianjun et al. |
| 5,648,283 A | 7/1997 | Tsang et al. |
| 5,670,425 A | 9/1997 | Schinella et al. |
| 5,789,118 A | 8/1998 | Liu et al. |
| 5,801,417 A | 9/1998 | Tsang et al. |
| 5,881,125 A | 3/1999 | Dao |
| 6,011,314 A | 1/2000 | Leibovitz et al. |
| 6,350,705 B1 | 2/2002 | Lin |
| 6,549,266 B1 | 4/2003 | Taniguchi |
| 7,105,379 B2 | 9/2006 | Tsao et al. |
| 7,402,908 B2 | 7/2008 | Gambee et al. |
| 8,008,196 B2 | 8/2011 | Gambee et al. |
| 2008/0248645 A1 | 10/2008 | Gambee et al. |

*Primary Examiner* — Jenny L Wagner
(74) *Attorney, Agent, or Firm* — TraskBritt

(57) ABSTRACT

A method of forming a metal pattern includes depositing a metal material over a photosensitive, insulative material and into a trench positioned over a bond pad. A photoresist material having a substantially planar surface may be formed over the metal material. A portion of the photoresist material may be etched to expose the metal material outside of the trench. The metal material may be isotropically etched to leave sidewalls of the metal protruding above surfaces of the photosensitive, insulative material outside of the trench. Some methods include removing a portion of a dielectric material to form at least one trench. Metal material and photoresist material may be deposited over the trench. A portion of the photoresist material may be etched to expose areas of the metal material. The metal material may be etched to form sidewalls of the metal material that protrude above the dielectric material.

20 Claims, 3 Drawing Sheets

METHODS OF FORMING A METAL PATTERN

CROSS-REFERENCE TO RELATED APPLICATIONS

This application is a continuation of U.S. patent application Ser. No. 13/104,215, filed May 10, 2011, now U.S. Pat. No. 8,329,580, issued Dec. 11, 2012, which is a continuation of U.S. patent application Ser. No. 12/139,969, filed Jun. 16, 2008, now U.S. Pat. No. 8,008,196, issued Aug. 30, 2011, which is a divisional of U.S. patent application Ser. No. 11/122,409, filed May 5, 2005, now U.S. Pat. No. 7,402,908, issued Jul. 22, 2008. The disclosure of each of the previously mentioned documents is hereby incorporated herein by reference in its entirety.

TECHNICAL FIELD

The present invention relates to a method of forming a semiconductor device. More specifically, the present invention relates to forming a metal pattern on a photosensitive dielectric layer of a semiconductor device.

BACKGROUND

Fabricating a semiconductor device that includes integrated circuits on a semiconductor wafer is a multi-step process. For instance, to form a redistribution layer ("RDL") on the semiconductor wafer, a dielectric layer is formed on an active surface of the semiconductor wafer, which also includes bond pads. A metal from which traces or redistribution lines of the RDL are to be formed is then blanket-deposited on the unpatterned dielectric layer. A photoresist layer is applied over the metal layer and patterned using conventional photolithographic techniques to form an etch mask for defining the traces. However, to form the etch mask, a stepper is needed to create line definitions in the photoresist layer by selective exposure thereof. The pattern in the photoresist layer is transferred to the metal layer using a wet etch process, forming the metal traces. The metal traces of the RDL are used to reroute original bond pad locations on, for example, a centerline or periphery of a semiconductor device to an array format, whereon solder bumps or other conductive elements for external connection of the semiconductor device may be applied or formed.

However, so-called "etch bias" is a problem with this process due to the substantially isotropic nature of the wet etch used to pattern the metal underlying the photoresist layer. The wet etch causes undercutting of the metal layer, which leads to the metal trace being smaller in width than the width of the corresponding pattern in the etch mask. The observed undercut is approximately the same for wide metal traces and narrow metal traces, which limits the size of the metal trace for a given thickness of the metal layer. With the decreasing size of features that are formed on semiconductor devices, etching must be accurate and feature dimensions maintained within very precise tolerances to preserve the alignment of, and optimize the electrical characteristics of, small features. However, the necessary degree of precision is not achieved with most conventional wet etch processes. As such, wet etch processes are typically used to faun larger features, such as those exhibiting dimensions above 3 µm. Therefore, as feature sizes on state-of-the-art semiconductor devices continue to decrease, the usefulness of wet etch processes becomes limited.

To reduce the undercutting of the metal layer, a dry etch process can be used during RDL fabrication. Since dry etch processes removal material substantially anisotropically, the dry etch is capable of accurately reproducing the features of the etch mask over the metal layer. However, most dry etch processes lack the etch specificity that is possessed by many wet etch processes. For instance, if a plasma etch is used, portions of photoresist ash resulting from use of this process attack the dielectric layer, producing an undesirable undercut of the dielectric layer. A dry etch process is also less desirable because the dry etch process is more complicated and expensive than a wet etch process.

To overcome these deficiencies, it would be desirable to be able to form a small feature metal pattern, such as metal traces of an RDL, using a wet etch process. In addition to extending the end-of-life expectation for wet etch capability as feature sizes continue to shrink, the dimensions of the resulting metal pattern are substantially similar to the dimensions of the pattern in the etch mask.

BRIEF SUMMARY

The present disclosure relates to methods of forming a metal pattern. Such a method may include forming at least one trench in a photosensitive, insulative material, the at least one trench positioned over at least one bond pad, farming a metal over the photosensitive, insulative material and into the at least one trench, forming a photoresist material over the metal, removing a portion of the photoresist material to expose elevated areas of the metal such that a remaining portion of the photoresist material does not extend beyond sidewalls of the at least one trench onto the elevated areas of the metal and removing the metal exposed laterally beyond the remaining portion of the photoresist material.

A method of forming a metal pattern may also include removing a portion of a dielectric material to form at least one trench overlying a bond pad on a substrate, forming a metal over the dielectric material and in the at least one trench, forming a photoresist material over the metal, removing a portion of the photoresist material adjacent the at least one trench to expose elevated areas of the metal and removing the metal outside the at least one trench to form sidewalls of a remaining portion of the metal that protrude above the elevated areas of the dielectric material.

The present invention also relates to a semiconductor device structure that includes at least one bond pad on a substrate, a dielectric material overlying the at least one bond pad and the substrate, the dielectric material comprising a photosensitive, insulative material, at least one trench in the dielectric material and positioned over the at least one bond pad, a metal overlying the dielectric material and surfaces of the at least one trench, sidewalls of the metal protruding above unrecessed surfaces of the dielectric material and a photoresist material overlying the metal.

BRIEF DESCRIPTION OF THE SEVERAL VIEWS OF THE DRAWINGS

While the specification concludes with claims particularly pointing out and distinctly claiming that which is regarded as the present invention, the advantages of this invention may be more readily ascertained from the following description of the invention when read in conjunction with the accompanying drawings in which:

DETAILED DESCRIPTION

A method of forming a metal pattern on a dielectric layer of a semiconductor device is disclosed. A metal is deposited in at least one trench or channel in the dielectric layer and on surrounding areas of the dielectric layer. The metal is selectively etched from the surrounding areas while the metal in the at least one trench remains protected, forming the metal pattern in the at least one trench. The metal pattern may form, by way of example only, a metal trace or a redistribution line of a redistribution layer ("RDL"). Since the at least one trench provides a defined area in which the metal is deposited, the metal pattern may be self-aligning. Therefore, the semiconductor device may not need to be precisely aligned after depositing the metal, as is currently needed in conventional processes of forming the RDL. By eliminating photoalignment, masking, and development steps, the complexity and cost of fabricating the semiconductor device may be reduced.

Figure 1:
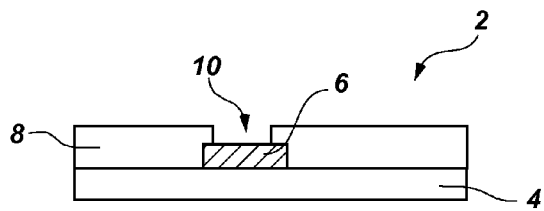
FIG. 1 schematically illustrates a cross-sectional view of a semiconductor device upon which a metal pattern is to be formed.

The semiconductor device 2 at a relatively late stage of processing is shown in FIGS. 1-11. The methods and semiconductor structures described herein do not form a complete process flow for manufacturing the semiconductor device 2. However, the remainder of the process flow is known to a person of ordinary skill in the art. Accordingly, only the process acts and semiconductor structures necessary to understand the present invention are described herein. As shown in FIG. 1, the semiconductor device 2 may include a substrate 4, at least one bond pad 6, and a passivation layer 8 having an opening 10 therethrough exposing at least a portion of the at least one bond pad 6. The at least one bond pad 6 is operably coupled to active circuitry (not shown) of semiconductor device 2, and may comprise, for example, a signal, power or ground or bias bond pad for the active circuitry. As used herein, the term "substrate" refers to a conventional substrate or other bulk substrate having a layer of semiconductor material. The term "bulk substrate" as used herein includes not only silicon wafers, but also silicon-on-insulator ("SOI") substrates, such as silicon-on-sapphire ("SOS") substrates and silicon-on-glass ("SOG") substrates, epitaxial layers of silicon on a base semiconductor foundation, and other semiconductor materials, such as silicon-germanium, germanium, gallium arsenide, or indium phosphide. The at least one bond pad 6 may be formed from a conductive material including, but not limited to, aluminum, copper, an alloy of aluminum and copper, or other appropriate conductive metal. The passivation layer 8 may be formed from a nitride or an oxide material, such as silicon dioxide ("SiO$_2$"), silicon nitride ("SiN"), or silicon oxynitride, or from a polyimide material. The bond pad 6 and the passivation layer 8 may be formed by conventional techniques, which are not described in detail herein. Opening 10 may be etched in the passivation layer 8, using conventional techniques, to expose the bond pad 6.

Figure 2:
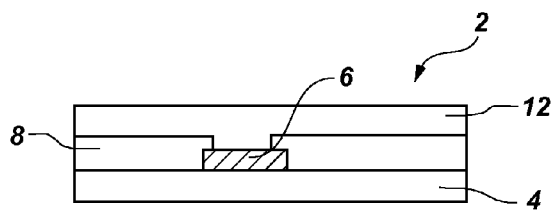
FIGS. 2-11 schematically illustrate cross-sectional views of the semiconductor device of FIG. 1 on which the metal pattern is formed in a trench thereon.

As shown in FIG. 2, a dielectric layer 12 may be formed over the passivation layer 8. The dielectric layer 12 may be formed from a photosensitive, insulative material including, but not limited to, a photosensitive polyimide, benzocyclobutene ("BCB"), or polybenzoxazole ("PBO"). Such photosensitive, insulative materials are known in the art and are processed in a manner similar to the processing of conventional photoresists, such as by using photolithographic techniques. Alternatively, a conventional dielectric material that is not photosensitive, such as SiO$_2$ or a polyimide that is not photosensitive, may be formed over the passivation layer 8. A photoresist material may be applied over the conventional dielectric material and selectively masked and etched, as described below in regard to the dielectric layer 12. In one embodiment, the dielectric layer 12 is a photosensitive, polyimide layer. While various embodiments herein describe that the dielectric layer 12 is formed from a polyimide, other photosensitive, insulative materials may also be used. Photosensitive, insulative materials are commercially available from various sources, such as Dow Corning (Midland, Mich.), Toray Industries (New York, N.Y.), and Sumitomo Plastics America, Inc. (Santa Clara, Calif.). In one embodiment, the photosensitive, insulative material is a PBO material, CRC7561, which is available from Sumitomo Plastics America, Inc. (Santa Clara, Calif.). The photosensitive, insulative material may have a negative tone or a positive tone, as known in the art. As also known in the art, the photosensitive, insulative material may be produced from a photosensitive monomeric precursor by conventional techniques. In addition to being photosensitive, the insulative material of the dielectric layer 12 may form a substantially planar upper surface so that subsequently deposited layers are substantially planar. In other words, any defects or other topographic irregularities present in the substrate 4 or passivation layer 8 may not be propagated to overlying layers.

The dielectric layer 12 may be of sufficient thickness to accommodate the trench 14, which is formed in the dielectric layer 12 as described in detail below. For instance, the thickness of the dielectric layer 12 may be greater than approximately 7 µm. After forming the trench 14, a portion of the dielectric layer 12 may remain between the bond pad 6 and the trench 14 if a connection therebetween is not desired. The remaining portion of the dielectric layer 12 may be of sufficient thickness to prevent crosstalk, such as a thickness of greater than approximately 5 µm. The dielectric layer 12 may be deposited on the passivation layer 8 by conventional techniques, such as by spin coating, bar coating, dip coating, spraying, flow coating, screen printing, extrusion, roller coating, or brush coating. In one exemplary embodiment, the dielectric layer 12 is applied by spin coating.

Figure 3:
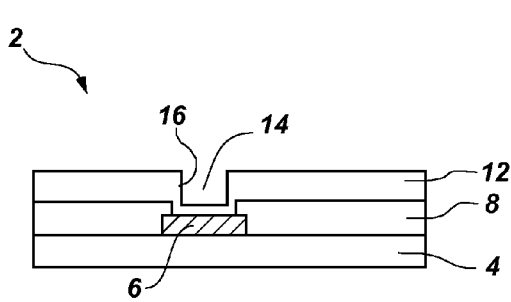

A phase-shifted reticle (not shown) or other reticle that partially blocks the transmission of energy to dielectric layer 12 may be used to form the trench 14 in the dielectric layer 12, as shown in FIG. 3. Phase-shifted reticles are known in the art, as described in U.S. Pat. No. 6,549,266 to Taniguchi; U.S. Pat. No. 5,881,125 to Dao; and U.S. Pat. No. 5,789,118 to Liu et al., the disclosures of each of which patents are incorporated herein by reference. Using the phase-shifted reticle to form the trench 14 may enable the pattern of the trench 14 to be transferred to the dielectric layer 12 more precisely than when using a conventional reticle. The phase-shifted reticle may also enable the trench 14 to have customized dimensions. The dimensions, such as the width and depth, of the trench 14 may substantially correspond to the dimensions of the opening or pattern in the phase-shifted reticle. In addition, the metal pattern that is ultimately deposited in the trench 14 may have dimensions that substantially correspond to the dimensions of the trench 14. Consequently, a desired line width of the metal trace may be defined by the bottom width of the trench 14, in contrast to conventional methods of forming the RDL where the line width is defined by the dimensions of the pattern in the etch mask. The desired line width of the metal trace may also be obtained by controlling the etching of the photoresist layer 20, which is described below.

While FIG. 3 shows a single trench 14, a plurality of trenches 14 may, in actuality, be formed on the dielectric layer 12. The trenches 14 may be formed on the dielectric layer 12 in locations where the metal pattern is ultimately desired. The phase-shifted reticle may include a substantially transparent base layer and an opaque layer having at least one opening therethrough. The opening in the phase-shifted reticle corresponds to a pattern of the trench 14 that is to be formed on the dielectric layer 12. In other words, the opening has dimensions that are substantially similar to the dimensions of the trench 14 that is ultimately to be formed. The phase-shifted reticle may also include at least one phase-shifter that transmits radiation and shifts the phase of the radiation approximately 180° relative to the opening. The radiation transmitted through the phase-shifter destructively interferes with the radiation from the opening, reducing the intensity of the radiation incident on the dielectric layer 12. Phase-shifted reticles are known in the art and, therefore, are not described in additional detail herein.

To form the trench 14, the phase-shifted reticle may be positioned over the semiconductor device 2 and appropriately aligned. Radiation may be passed through the phase-shifted reticle and onto the dielectric layer 12. The radiation may be visible light, ultraviolet ("UV") light, electron beam ("EB"), or X-ray radiant energy, depending on the material used in the dielectric layer 12. For instance, if the dielectric layer 12 is a polyimide layer, UV radiation may be used to expose the dielectric layer 12. In one embodiment, the UV radiation used to expose the dielectric layer 12 may have a wavelength that ranges from approximately 360 nm to approximately 465 nm and an exposure energy ranging from approximately 100 $mJ/cm^2$ to approximately 3,000 $mJ/cm^2$. For instance, the UV radiation may be produced by a broadband UV mercury source having wavelengths of approximately 365 nm and 463 nm. As the radiation passes through the phase-shifted reticle, portions of the dielectric layer 12 are exposed to the radiation. Depending on whether the dielectric layer 12 is a negative tone or a positive tone photoresist, the nonexposed portions or the exposed portions may be developed and removed using a conventional developing solution. For the sake of example, the developing solution used to develop the polyimide or the PBO may be a dilute solution of aqueous tetramethylammonium hydroxide ("TMAH"). If the dielectric layer 12 is formed from BCB, the developing solution may be an organic solvent. Since the photosensitive, insulative material is commercially available, the trench 14 may be formed by exposing and developing the dielectric layer 12 according to the manufacturer's directions. Commercially available, photosensitive polyimides typically have a negative tone and, therefore, the portions of the polyimide layer exposed to the radiation may remain after development. However, photosensitive polyimides with a positive tone are also commercially available. The portions of the dielectric layer 12 that are removed may form the trench 14, while the portions of the dielectric layer 12 that remain on the semiconductor device 2 may function as an insulator. After forming the trench 14, the dielectric layer 12 may be dried or cured. Alternatively, the dielectric layer 12 may be dried or cured before forming the trench 14. Preferably, the dielectric layer 12 is cured after performing all of the photosteps used in forming the trench 14, which minimizes the number of masking and etching steps.

Figure 4:
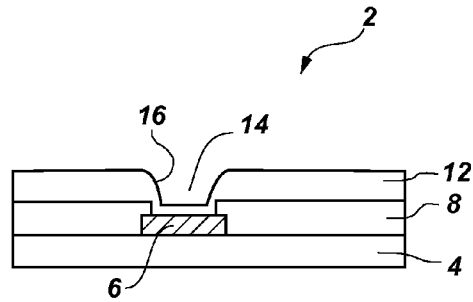

The trench 14 may have a depth of greater than approximately 2 μm. Sidewalls 16 of the trench 14 may be sloped (as shown in FIG. 4) or may be substantially vertical (as shown in FIG. 3) depending on a sidewall profile of the dielectric layer 12. The sidewall angle of the trench 14 may range from sloped to substantially vertical depending on the resolution of the phase-shifted reticle and the developing solution used to develop the dielectric layer 12. In one embodiment, the sidewalls 16 of the trench 14 are substantially vertical. The trench 14 may ultimately be partially filled with a metal to form the metal trace, which is connected by an opening to the bond pad 6. Since the trench 14 is partially filled with the metal, the sidewall angle of the trench 14 may also affect the sidewall profile of the metal pattern deposited in the trench 14.

Figure 5:
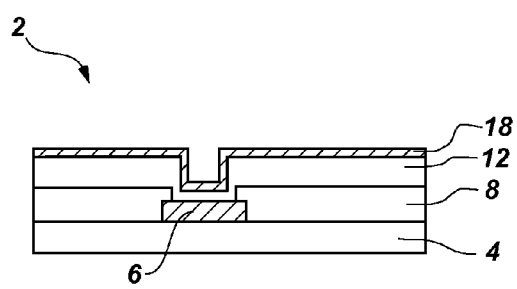

A metal layer 18 may be formed over the dielectric layer 12, as illustrated in FIG. 5. The metal layer 18 may be formed from a metal that is etchable, such as a metal that is etchable by a wet etch process or a dry etch process. The metal may be aluminum, copper, an alloy of aluminum and copper, nickel, gold, titanium, nickel vanadium, or layers or mixtures thereof. In one embodiment, the metal layer 18 is a layer of aluminum. The metal may be deposited so that the metal layer 18 contacts the top surface of the dielectric layer 12, including the top surface of the trench 14. In other words, the metal may be deposited substantially conformally, so that the topography of the trench 14 is maintained. The metal layer 18 may be deposited by chemical vapor deposition ("CVD"), atomic layer deposition ("ALD"), plasma enhanced chemical vapor deposition ("PECVD"), physical vapor deposition ("PVD," also known as sputtering), electroplating, electroless plating, or other conventional techniques. In one exemplary embodiment, the metal layer 18 is formed by PVD.

Figure 6:
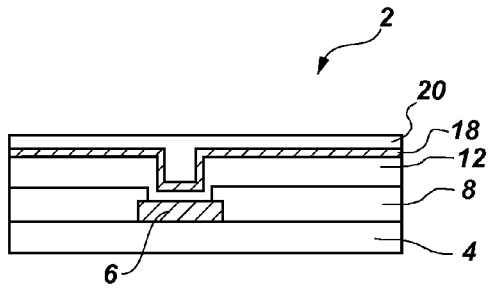

A photoresist layer 20 may be formed over the metal layer 18, filling the remaining portion of trench 14 with photoresist and forming a thin coating of photoresist on elevated areas, such as areas of the metal layer 18 adjacent to or surrounding the trench 14, as shown in FIG. 6. Since the surface of the dielectric layer 12 is substantially planar and the metal layer 18 is deposited conformally over the dielectric layer 12, the photoresist may pool in low-lying areas of the semiconductor device 2, such as in the portion of trench 14 unfilled by metal layer 18. A top surface of the photoresist layer 20 may be substantially planar so that little or none of the topography of the trench 14 is maintained. The photoresist may be a conventional photoresist, such as a photoresist that includes a photoactive compound ("PAC"). For the sake of example only, the photoresist material may be IX405, which is available from JSR Corp. (Japan). However, to reduce the cost of the photoresist layer 20, a photoresist material lacking the PAC may also be used. Photoresists are known in the art and, therefore, are not discussed in detail herein.

The photoresist layer 20 may be deposited by spin coating so that the photoresist fills the trench 14 while forming the thin coating on the surrounding elevated areas of metal layer 18. To achieve this coverage, the photoresist may be applied to the semiconductor device 2, which is quickly spun at high speeds and then stopped to disperse the photoresist into the trench 14 and over the elevated areas of metal layer 18. The revolutions per minute, acceleration, temperature, and spin time may be adjusted to achieve the desired coating depth of the photoresist layer 20. Other conventional techniques of applying the photoresist may also be used so that the photoresist pools in the trench 14 and forms the thin coating on the surrounding, elevated areas of dielectric layer 12.

Figure 7:
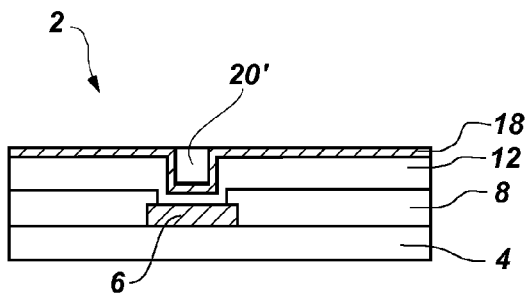

As illustrated in FIG. 7, portions of the photoresist layer 20 may be removed to expose the metal layer 18 on the elevated areas of metal layer 18 (i.e., the areas adjacent to the trench 14). However, the photoresist layer portion 20' may remain in the trench 14, protecting the underlying metal layer 18 from subsequent processing steps. The photoresist layer 20 may be selectively removed from the elevated areas using a plasma etch process to ash the thinner portion of the photoresist layer 20 outside the trench 14, or a conventional dry etch or a wet etch process may be employed, using the metal layer 18 outside the trench 14 as an etch stop. Dry etches and wet etches that are capable of removing photoresist materials without damage to other portions of a semiconductor substrate are known in the art and may be selected by one of ordinary skill in the art. The ashing or etch process may uniformly remove the photoresist layer 20 so that the portions of the photoresist layer 20 over the elevated areas are removed before the thicker portion of the photoresist layer 20' in the trench 14. As known in the art, the temperature, pressure and other process conditions of the selected ash or etch process may be adjusted to achieve the desired removal rate of the photoresist layer 20. To prevent the removal process from removing all of the photoresist layer 20, such as the photoresist in the trench 14, the removal process may be allowed to proceed for a limited duration of time. In other words, the removal process may be allowed to proceed for an amount of time sufficient to remove the thinner portion of photoresist layer 20 over the elevated areas of metal layer 18 without etching the thicker portion of photoresist layer 20' in the trench 14. As noted above, once the photoresist layer 20 over the elevated areas has been removed, the exposed metal layer 18 acts as an etch stop and is used to indicate the desired end point of the removal process as, if the removal process is allowed to continue, the photoresist layer 20' in the trench 14 may undesirably be removed.

The process used to remove the photoresist layer 20 may include, but is not limited to, glow-discharge sputtering, ion milling, reactive ion etching ("RIE"), reactive ion beam etching ("RIBE"), plasma etching (ashing), point plasma etching, magnetic ion etching, magnetically enhanced reactive ion etching, plasma enhanced reactive ion etching, electron cyclotron resonance, or high-density plasma etching. The dry etch process may isotropically remove the photoresist layer 20 from the elevated areas, leaving the portion of photoresist layer 20' in the trench 14. The dry etch process may be used if the photoresist layer 20 does not include a PAC. In one embodiment, the photoresist layer 20 is removed from the elevated portions of the metal layer 18 by RIE. In this situation, an oxygen plasma that includes oxygen radicals may be formed and used to ash the photoresist layer 20. The oxygen may react with the photoresist layer 20 to form water, carbon dioxide, carbon monoxide, and other carbon and hydrocarbon compounds, stripping the photoresist layer 20 from the elevated portions of the metal layer 18. In another embodiment, the photoresist layer 20 is removed from the elevated portions of the metal layer 18 by ashing. If the photoresist layer 20 includes a PAC, the portions of the photoresist layer 20 over the elevated areas may be removed using a wet etch process. For the sake of example only, TMAH, organic solvents, or mixtures thereof may be used to wet etch the photoresist layer 20.

Figure 8:
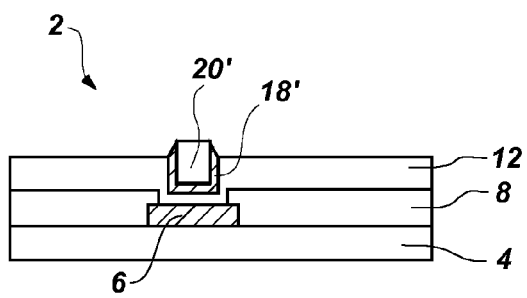
Figure 9:
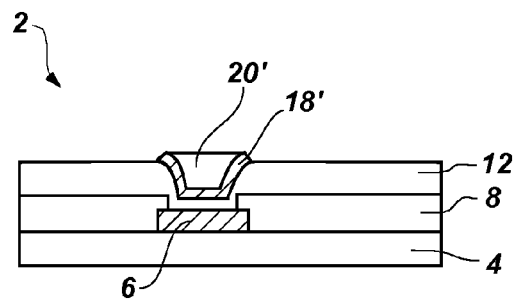

The exposed portions of the metal layer 18, such as the portions of the metal layer 18 over the elevated areas of dielectric layer 12, may then be removed, as shown in FIGS. 8 and 9. FIG. 8 illustrates an embodiment where the sidewall angle of the dielectric layer 12 is substantially vertical while FIG. 9 illustrates an embodiment where the sidewall angle of the dielectric layer 12 is substantially sloping. The exposed portions of the metal layer 18 may be removed using a wet etch process that is selective for the metal of the metal layer 18. Thus, the metal layer 18 over the elevated areas may be removed without damaging or otherwise negatively affecting the portion of photoresist layer 20' in the trench 14 or the underlying metal layer 18' remaining in the trench 14. The wet etch process may isotropically etch the exposed portions of the metal layer 18 while the portion of metal layer 18' remains in the trench 14, protected by the remaining portion of photoresist layer 20'. For the sake of example only, the exposed portions of the metal layer 18 may be etched at approximately 40° C. using a solution of 100:10:1 by volume of deionized water:nitric acid ("$HNO_3$"):hydrofluoric acid ("HF"). The remaining portions of the metal layer 18 may then be rinsed at 30° C. with a solution of 5:1:1 by volume of deionized water:ammonium hydroxide ("$NHO_4$"):hydrogen peroxide ("$H_2O_2$"), followed by a second rinse with deionized water. The remaining portions of the metal layer 18 may then be blown dry with nitrogen. The exposed portions of the metal layer 18 may also be etched with a commercially available etchant, such as a mixture of phosphoric acid/$HNO_3$/acetic acid. Since the portion of metal layer 18' is protected by the portion of photoresist layer 20', the isotropic nature of the wet etch process may not cause undercutting of the portion of metal layer 18', which ultimately forms the metal trace or the redistribution line of the RDL.

Figure 10:
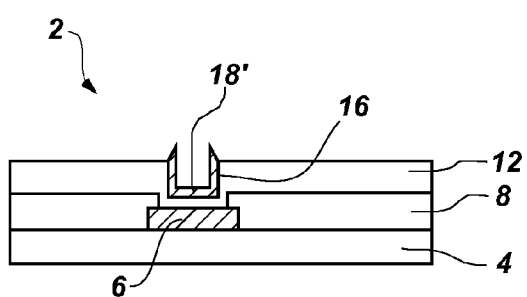
Figure 11:
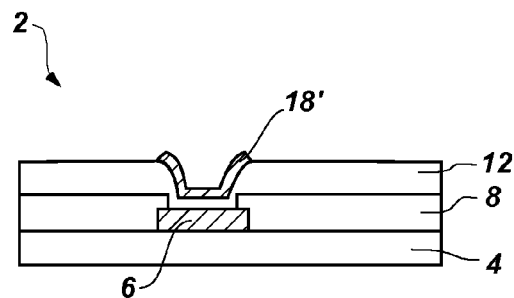

The portion of the photoresist layer 20' remaining in the trench 14 may subsequently be removed, exposing the underlying portion of metal layer 18', as shown in FIGS. 10 and 11. The portion of photoresist layer 20' may be removed by a conventional wet etch process that is selective for the material of the portion of photoresist layer 20'. In other words, the wet etch process does not damage or otherwise negatively affect the dielectric layer 12 or the underlying portion of metal layer 18'. For the sake of example only, the photoresist layer 20' may be etched using one of the etchants previously described. The profile of the portion of metal layer 18' in the trench 14 may depend on the sidewall angle of the dielectric layer 12. If the sidewall angle of the dielectric layer 12 is substantially vertical, sidewalls of the portion of metal layer 18' may be substantially vertical, as shown in FIG. 10. If the sidewall angle of the dielectric layer 12 is sloping, sidewalls of the portion of metal layer 18' may be sloping, as shown in FIG. 11. In one embodiment, the portion of metal layer 18' has substantially vertical sidewalls 16. The portion of metal layer 18' in the trench 14 may form the metal trace or redistribution line of the RDL. As previously discussed, the metal trace may form a connection to the bond pad 6 if the portion of metal layer 18' in trench 14 is deposited in contact therewith after an appropriately deep portion of trench 14 has been formed using the aforementioned phase-shifted reticle and radiation. As well as being used to redistribute external connections for bond pads 6, metal traces formed according to the present invention may be used to connect to additional electronic components, such as capacitors, inductors, resistors, fuses, or controllers, on the semiconductor device 2. As known in the art, the phase-shifted reticle may be employed to control the depth to which the photosensitive material of dielectric layer 12 is exposed, to selectively expose the entire depth of dielectric layer 12 over bond pads 6 to ensure that metal layer 18' is applied in contact therewith.

Figure 12:
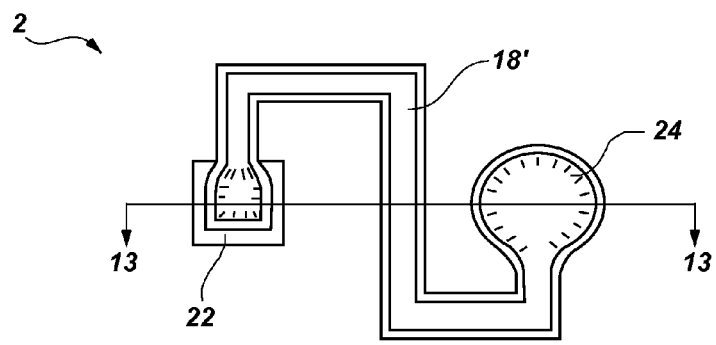
FIG. 12 schematically illustrates a top view of an exemplary redistribution layer trace.
Figure 13:
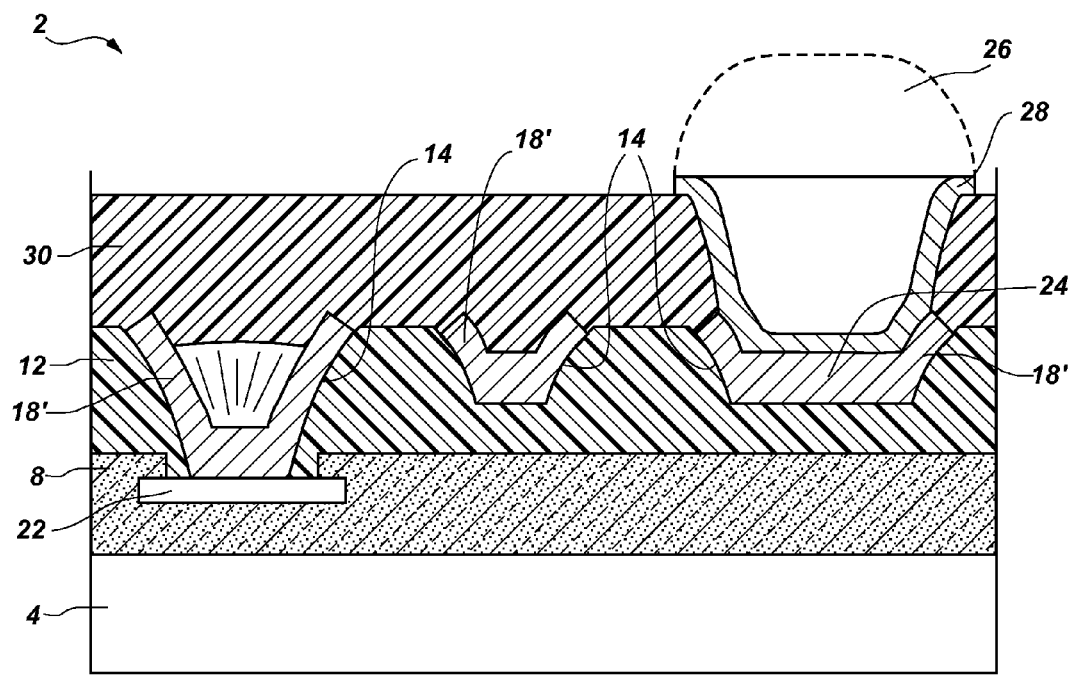
FIG. 13 schematically illustrates a cross-sectional view of the exemplary redistribution layer trace of FIG. 12, taken across line 13-13.

FIG. 12 illustrates a top view of a resulting RDL trace on the semiconductor device 2. The RDL trace extends from inner lead bond pad 22 (which corresponds to previously mentioned bond pad 6) and comprises the metal layer 18' formed as a trace and extending to an enlarged terminal segment comprising outer lead bond pad 24. The metal layer 18' including the outer lead bond pad 24 may be formed from one of the conductive materials previously described for use in metal layer 18 and which is compatible with the material of inner lead bond pad 22. FIG. 13 is a cross-sectional view of the RDL trace of FIG. 12 showing metal layer 18' electrically connected to the inner lead bond pad 22 and extending to the outer lead bond pad 24. As known in the art, a solder bump 26 (shown in broken lines in FIG. 13) may be formed or disposed on an under-bump-metallization ("UBM") 28 formed over the outer lead bond pad 24 exposed through an aperture formed in second dielectric layer 30 disposed over the dielectric layer 12 and the RDL trace. As known in the art, UBM 28 may comprise one or more layers of metal to enhance wetting and bonding between the material of outer lead bond pad 24 and solder bump 26. Using the phase-shifted reticle to form the RDL trace may enable the depth of the trench 14 to be controlled. For instance, as shown in the left-hand side of FIG. 13, the depth of the trench 14 formed substantially over the inner lead bond pad 22 may be greater than the depth of the remainder of trench 14 extending to the location of outer lead bond pad 24 to expose the surface of inner lead bond pad 22 to the metallization of metal layer 18' for conductive contact therewith. For the sake of clarity, the portion of second dielectric layer 30 filling the portion of trench 14 over inner lead bond pad 22 has been removed to show how metal layer 18' ramps up from inner lead bond pad 22 to the portion of trench 14 of a lesser depth leading to outer lead bond pad 24. As shown, the phase-shifted reticle may be used to selectively increase or decrease the depth of exposure through the dielectric layer 12 to vary the depth of trench 14 in a controlled or selective manner. The RDL trace (metal layer 18') on the semiconductor device 2, including the outer lead bond pad 24 may be substantially contained or received within the dielectric layer 12, as shown in FIG. 13. The RDL trace may be three-dimensional and may have a substantially horizontal bottom portion that is adjacent to, and flanked by, two upwardly extending and substantially vertical or sloping side portions.

Since the portion of metal layer 18' and the dielectric layer 12 are in contact over three surfaces (bottom and sides of trench 14), adhesion between the portion of metal layer 18' and the dielectric layer 12 may be improved. In addition, shear strength between the solder bump 26 and the outer lead bond pad 24 may be improved. To further improve adhesion of metal layer 18', an optional, intervening adhesion layer may be disposed between the metal layer 18' and the dielectric layer 12. The adhesion layer may be formed from metals that include, but are not limited to, titanium, titanium-tungsten, or chromium and may be deposited by conventional techniques, such as ALD, CVD, PECVD, PVD or vacuum evaporation.

The method of the present invention may be used to form the metal pattern in the dielectric layer 12 using conventional equipment, such as equipment that is currently used in the semiconductor industry. As such, new equipment does not need to be developed or purchased to implement this method. In addition, wet etch processes may continue to be used to form RDLs because the dimensions of the resulting metal trace are substantially the same as the dimensions of the trench 14 and of the opening in the phase-shifted reticle. In other words, no undercutting of the metal trace occurs during the method of the present invention. Therefore, the capability of wet etch processes to form the RDL may be extended, which delays the necessity of converting to a more complicated and expensive dry etch process as feature sizes become smaller. Furthermore, since the metal pattern is formed in the trench 14 using the pooling photoresist, a stepper need not be used to create the line definitions in the photoresist layer, as is needed in conventional methods of forming an RDL trace, since the trench 14 defines the location, orientation and dimensions of the resulting trace and is, thus, self-aligning. The coplanarity between the portion of metal layer 18' and the dielectric layer 12 may also be improved since the portion of metal layer 18' is substantially contained within trench 14, which improves the planarity of the overall RDL and reduces the required thickness thereof.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents, and alternatives falling within the scope of the invention as defined by the following appended claims.

What is claimed is:

1. A method of forming a metal pattern, comprising:
    depositing a metal material over a photosensitive, insulative material and into at least one trench in the photosensitive, insulative material positioned over at least one bond pad;
    forming a photoresist material having a substantially planar surface over the metal material;
    etching a portion of the photoresist material to expose areas of the metal material outside of the at least one trench; and
    isotropically etching a portion of the exposed metal material to leave sidewalls of a remaining portion of the metal material protruding above surfaces of the photosensitive, insulative material outside of the at least one trench.

2. The method of claim 1, wherein depositing a metal material over a photosensitive, insulative material and into at least one trench therein comprises depositing the metal material by at least one of chemical vapor deposition, atomic layer deposition, plasma enhanced chemical vapor deposition, physical vapor deposition, electroplating, and electroless plating.

3. The method of claim 1, wherein forming a photoresist material having a substantially planar surface over the metal material comprises spin-coating the photoresist material over the metal material.

4. The method of claim 1, wherein etching a portion of the photoresist material comprises using at least one of glow-discharge sputtering, ion milling, reactive ion etching, reactive ion beam etching, plasma etching, point plasma etching, magnetic ion etching, magnetically enhanced reactive ion etching, plasma enhanced reactive ion etching, electron cyclotron resonance, and high-density plasma etching.

5. The method of claim 4, wherein etching a portion of the photoresist material further comprises using the metal material as an etch stop.

6. The method of claim 4, wherein etching a portion of the photoresist material further comprises using a plasma etch process to ash a portion of the photoresist material extending beyond sidewalls of the at least one trench.

7. The method of claim 1, wherein etching a portion of the photoresist material comprises isotropically removing a portion of the photoresist material from the metal material outside of the at least one trench.

8. The method of claim 1, wherein isotropically etching a portion of the exposed metal material comprises exposing a portion of the metal material to a solution comprising water and at least one acid.

9. The method of claim 8, wherein exposing a portion of the metal material to a solution comprising water and at least one acid comprises exposing a portion of the metal material to an aqueous solution comprising at least one of nitric acid, hydrofluoric acid, phosphoric acid, and acetic acid.

10. The method of claim 9, further comprising rinsing at least a portion of the exposed metal material with a solution comprising water, ammonium hydroxide, and hydrogen peroxide.

11. The method of claim 10, further comprising rinsing at least a portion of the exposed metal material with deionized water.

12. The method of claim 1, further comprising removing remaining photoresist material.

13. A method of forming a metal pattern, comprising:
   removing a portion of a dielectric material to form at least one trench overlying a bond pad on a substrate;
   depositing a metal material over the dielectric material and in the at least one trench;
   forming a photoresist material over the metal material, the photoresist material filling the at least one trench;
   etching a portion of the photoresist material adjacent the at least one trench to expose areas of the metal material; and
   etching the metal material from surfaces of the dielectric material external to the at least one trench to form sidewalls of a remaining portion of the metal material that protrude above the dielectric material.

14. The method of claim 13, wherein removing a portion of a dielectric material to form at least one trench overlying a bond pad on a substrate comprises forming a trench having sloped sidewalls.

15. The method of claim 13, wherein removing a portion of a dielectric material to form at least one trench overlying a bond pad on a substrate comprises &Lining a trench having substantially vertical sidewalls.

16. The method of claim 13, wherein removing a portion of the dielectric material to form at least one trench overlying a bond pad on a substrate comprises forming the at least one trench in a dielectric material selected from the group consisting of a polyimide, benzocyclobutene, polybenzoxazole, and silicon dioxide.

17. The method of claim 13, wherein removing a portion of a dielectric material to form at least one trench overlying a bond pad on a substrate comprises leaving a portion of the dielectric material over the bond pad.

18. The method of claim 13, wherein forming a photoresist material over the metal material comprises forming a photoresist having a substantially planar surface.

19. The method of claim 13, wherein depositing a metal material over the dielectric material and in the at least one trench comprises depositing the metal material by at least one of chemical vapor deposition, atomic layer deposition, plasma enhanced chemical vapor deposition, physical vapor deposition, electroplating, and electroless plating.

20. The method of claim 13, wherein etching the metal material from surfaces of the dielectric material external to the at least one trench comprises exposing a portion of the metal material to a solution comprising water and at least one acid.

* * * * *

UNITED STATES PATENT AND TRADEMARK OFFICE
CERTIFICATE OF CORRECTION

| | | |
|---|---|---|
| PATENT NO. | : 8,470,710 B2 | Page 1 of 1 |
| APPLICATION NO. | : 13/610471 | |
| DATED | : June 25, 2013 | |
| INVENTOR(S) | : Gambee et al. | |

It is certified that error appears in the above-identified patent and that said Letters Patent is hereby corrected as shown below:

In the Claims:

In column 12, line 1, in Claim 15, delete "&Lining" and insert -- forming --, therefor.

Signed and Sealed this
Tenth Day of September, 2013

Teresa Stanek Rea
*Acting Director of the United States Patent and Trademark Office*